United States Patent
Hu

(10) Patent No.: US 10,600,850 B2
(45) Date of Patent: Mar. 24, 2020

(54) METHOD OF FABRICATING FILM, METHOD OF FABRICATING ARRAY SUBSTRATE, AND DISPLAY PANEL

(71) Applicant: BOE TECHNOLOGY GROUP CO., LTD., Beijing (CN)

(72) Inventor: Chunjing Hu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/767,483

(22) PCT Filed: Nov. 2, 2017

(86) PCT No.: PCT/CN2017/109096
§ 371 (c)(1),
(2) Date: Apr. 11, 2018

(87) PCT Pub. No.: WO2018/201681
PCT Pub. Date: Nov. 8, 2018

(65) Prior Publication Data
US 2019/0058019 A1     Feb. 21, 2019

(30) Foreign Application Priority Data

May 3, 2017 (CN) .......................... 2017 1 0303760

(51) Int. Cl.
*H01L 27/32* (2006.01)
*H01L 51/00* (2006.01)
(Continued)

(52) U.S. Cl.
CPC .......... *H01L 27/3246* (2013.01); *H01L 51/00* (2013.01); *H01L 51/001* (2013.01);
(Continued)

(58) Field of Classification Search
CPC ... H01L 27/3246; H01L 51/001; H01L 51/56; H01L 51/0005; H01L 51/00; H01L 51/50
(Continued)

(56) References Cited

U.S. PATENT DOCUMENTS

2012/0304483 A1* 12/2012 Sirard et al. ...... H01L 21/02057
                                                                   34/289
2017/0279049 A1* 9/2017 Dai ..................... H01L 51/0005
2017/0346008 A1   11/2017 Xu et al.

FOREIGN PATENT DOCUMENTS

CN         105467682 A      4/2016
CN         105774279 A      7/2016
(Continued)

OTHER PUBLICATIONS

JP 2006/181189 (A) by Tanaka et al., ink jet coating solution and drying method date: Oct. 19, 2006 (year 2006).*
(Continued)

*Primary Examiner* — Thinh T Nguyen
(74) *Attorney, Agent, or Firm* — Westerman, Hattori, Daniels & Adrian, LLP

(57) ABSTRACT

The present invention is related to a method of fabricating a film. The method may comprise filling ink droplets containing a solvent and material constituting the film into pixel units of an array substrate; freezing the ink droplets on the array substrate; and sublimating the solvent of the ink droplets on the array substrate. The pixel units of the array substrate may be separated by a pixel define layer and arranged in a matrix.

12 Claims, 7 Drawing Sheets

(51) Int. Cl.
    *H01L 51/56*    (2006.01)
    *H01L 51/50*    (2006.01)
(52) U.S. Cl.
    CPC .......... *H01L 51/0005* (2013.01); *H01L 51/56* (2013.01); *H01L 51/50* (2013.01)
(58) Field of Classification Search
    USPC ............. 257/40, 59, 72; 438/82, 99, 48, 128
    See application file for complete search history.

(56) References Cited

FOREIGN PATENT DOCUMENTS

CN      106585157 A     4/2017
JP      2006281189 A    10/2006

OTHER PUBLICATIONS

International Search Report dated Feb. 11, 2018, issued in counterpart Application No. PCT/CN2017/109096 (10 pages).
Office Action dated Jun. 25, 2019, issued in counterpart CN Application No. 201710303760.3, with English translation (13 pages)

* cited by examiner

Prior Art

Prior Art

Prior Art

Prior Art

METHOD OF FABRICATING FILM, METHOD OF FABRICATING ARRAY SUBSTRATE, AND DISPLAY PANEL

CROSS-REFERENCE TO RELATED APPLICATIONS

This application claims the benefit of the filing date of Chinese Patent Application No. 201710303760.3 filed on May 3, 2017, the disclosure of which is hereby incorporated by reference.

TECHNICAL FIELD

This invention relates to a display technology, and more particularly, to a method of fabricating a film, a method of fabricating an array substrate, and a display panel.

BACKGROUND

At present, in the field of organic light emitting devices and liquid crystal displays, organic functional thin films and colored films are typically formed using an inkjet printing process. An indispensable step in the inkjet printing process is to require subsequent procedures to remove excess solvent and then form a desirable film by drying. This solvent removal process determines morphology of the film. For an optoelectronic display device, morphology and uniformity of the dried film have a great impact on expected life of the device and display effect.

BRIEF SUMMARY

Accordingly, one example of the present disclosure is a method of fabricating a film. The method of fabricating a film may comprise filling ink droplets containing a solvent and material constituting the film into pixel units of an array substrate; freezing the ink droplets on the array substrate; and sublimating the solvent of the ink droplets on the array substrate. The pixel units of the array substrate may be separated by a pixel define layer and arranged in a matrix. The ink droplets may be filled into the pixel units of the array substrate by an inkjet printing method or an ink dropping method. Freezing the ink droplets on the array substrate may comprise placing the array substrate into a freezer after filling the ink droplets; adjusting a temperature of the freezer to a value not exceeding a solidification temperature of the ink droplets; and freezing the ink droplets on the array substrate. In one embodiment, the array substrate may be placed into the freezer within 1 minute after filling the ink droplets.

Sublimating the solvent of the ink droplets on the array substrate in vacuum may comprise placing the array substrate into a vacuum chamber, adjusting a pressure of the vacuum chamber to a value not exceeding a triple point pressure of the solvent of the ink droplets; adjusting a temperature of the vacuum chamber to a value greater than a triple point temperature of the solvent of the ink droplets; and sublimating the solvent of the ink droplets on the array substrate in vacuum. Sublimating the solvent of the ink droplets on the array substrate in vacuum may be performed for a time within a range of 30 seconds to 30 minutes.

The method of fabricating a film may further comprise adjusting the temperature and the pressure of the vacuum chamber to a condition the solvent of the ink droplets evaporates after sublimating the solvent of the ink droplets, and evaporating the solvent of the ink droplets.

Another example of the present disclosure is a method for fabricating an array substrate. The method for fabricating an array substrate may comprise the method of fabricating a film according to one embodiment of the present disclosure.

Another example of the present disclosure is an array substrate. The array substrate may be fabricated according to one embodiment of the present disclosure. In one embodiment, in the array substrate, the pixel define layer may include a lyophilic layer and a lyophobic layer. The lyophobic layer may be above the lyophilic layer. The lyophilic layer may include a first sub-film layer and a second sub-film layer. The first sub-film layer may be below the second sub-film layer, and a positive projection of the first sub-film layer on the base substrate may be larger than a positive projection of the second sub-film layer on the base substrate.

Another example of the present disclosure is a display panel. The display panel may comprise the array substrate according to one embodiment of the present disclosure. The display panel may be an organic light emitting display panel.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1A:
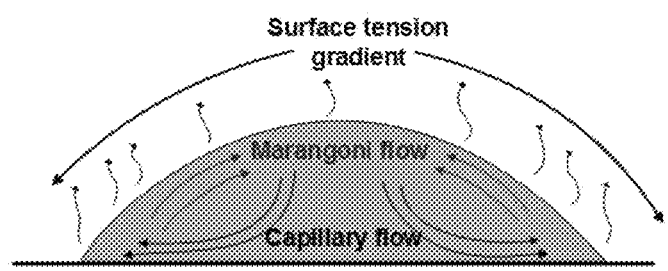
FIG. 1a is a schematic diagram of principles of drying a droplet on a flat surface.

The present invention will be described in further detail with reference to the accompanying drawings and embodiments in order to provide a better understanding of the technical solutions of the present invention by those skilled in the art. Throughout the description of the invention, reference is made to FIGS. 1-7. When referring to the figures, like structures and elements shown throughout are indicated with like reference numerals.

Figure 1B:
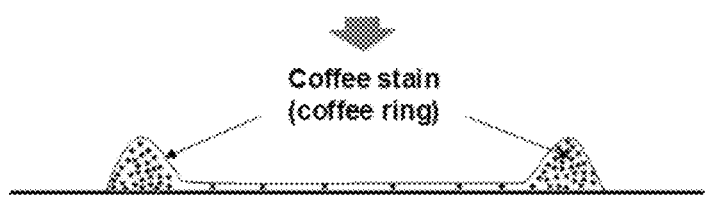
FIG. 1b is a schematic diagram of coffee ring phenomenon after drying of a droplet on a flat surface.

FIG. 1a shows a schematic diagram of principles of drying a droplet on a flat surface. FIG. 1b shows a schematic diagram of coffee ring phenomenon after drying of a droplet on a flat surface. Specifically, when an ink droplet is dropped onto a substrate or a pixel unit, due to the shape of the ink droplet, a center region of the droplet has a relatively small volume to unit area ratio and an edge region of the droplet has a relatively large volume to unit area ratio. Thus, the center region and the edge region of the droplet evaporate at different speeds. That is, the edge region of the ink droplet dries faster. With fast evaporation of the solvent at the edge region of the droplet, contents of solvent at the central and edge regions become different, thereby forming a gradient of solvent concentration. As a result, the solvent flows from the central region to the edge region through a capillary compensatory flow phenomenon. Simultaneously, some solutes are brought to the edge region due to this flow of the solvent, thereby increasing an amount of solute at the edge region. Eventually, the inklet droplet dries and forms a coffee ring phenomenon.

Furthermore, besides the capillary compensatory flow from the center region to the edge region of the droplet, an inverse Marangoni flow phenomenon occurs inside the droplet. Morphology of a dried film is determined by interaction effect of these two micro flow phenomena. A fundamental cause of the Marangoni convection is a gradient difference of surface tension at different parts of the droplet inside the droplet. This gradient difference of surface tension can be caused by many factors such as temperature gradients, concentration gradients, change of solvent composition, and the like.

Furthermore, formation of coffee ring phenomenon requires a condition, which is pinning of a contact line between the droplet and the solid surface. Moving and pinning of the contact line is a complex process, which depends on various factors such as droplet characteristics such as boiling point, viscosity, and surface tension, interfacial hydrophobic or hydrophilic characteristics, and interfacial tension between the liquid and the solid.

In summary, formation of coffee ring phenomenon requires several conditions. The first one is Marangoni convection phenomenon during evaporation of solvent. The second one is pinning effect during drying of solute. The present strategy of solving the above problem in the prior art is mainly to change the Marangoni convection phenomenon, for example, by adding ellipsoidal particles to the ink droplets, adjusting pH of the solution, adding a second solvent or additive, or electrowetting etc. Some of these methods also have a side effect of improving the pinning effect. One main method is to add a small amount of surfactant in the ink droplets to change the difference of surface tension at different parts of the ink droplet during the drying process to improve Marangoni convection, thereby improving flatness of the film after drying. However, for organic light emitting display (OLED) devices, surfactants and other additives often result in a decrease in device performance. Therefore, it is impractical to use this method for an OLED device.

Figure 2:
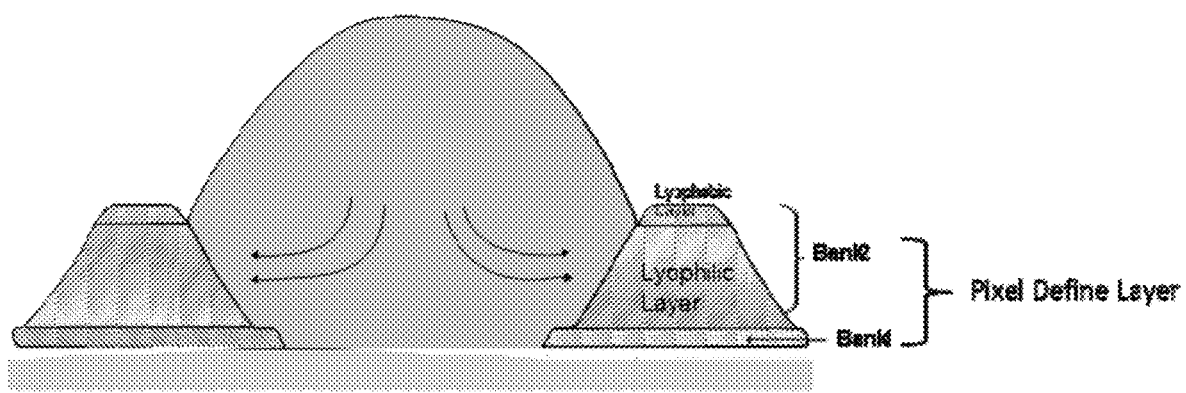
FIG. 2 is a schematic diagram of morphology of an ink droplet in a pixel unit in the prior art.
Figure 3:
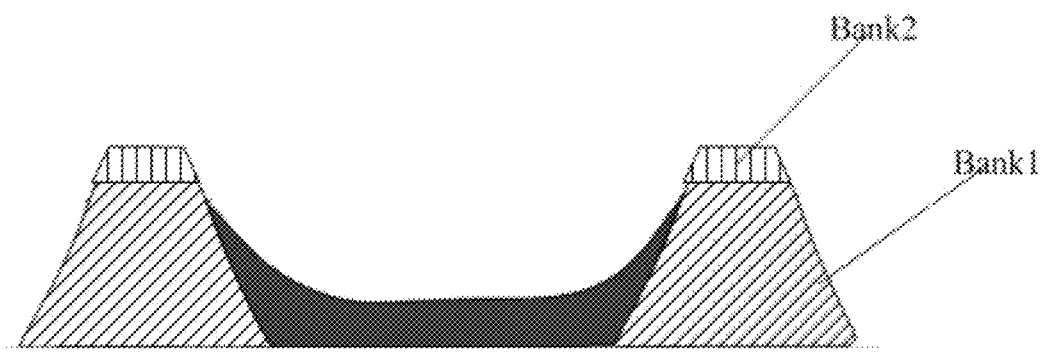
FIG. 3 is a schematic view of morphology of a film after drying in a pixel unit in the prior art.
Figure 4:
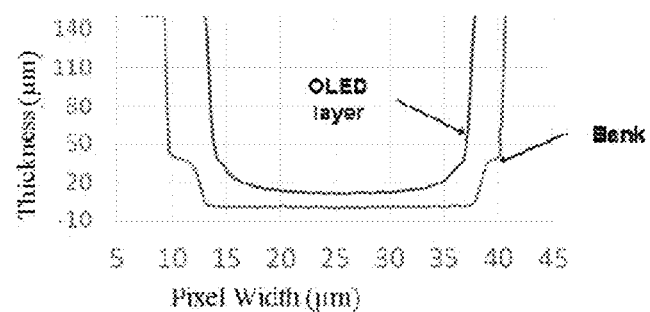
FIG. 4 is a schematic diagram of a cross-section of a dried film in a pixel unit in the prior art.

In addition, the above methods are suitable for droplets spreading and drying on a flat surface. There are few drying methods that are suitable for drying droplets in pixel units. FIG. is a schematic diagram of morphology of an ink droplet in a pixel unit in the prior art. As shown in FIG. 2, a pixel define layer used in a conventional ink jet printing process has a two-layer structure. The first layer, Bank1 as shown in FIG. 2, is lyophilic. The second layer, Bank2 as shown in FIG. 2, has an organic resin structure. Only a surface layer of the second layer has a lyophobic characteristic, and most of the second layer in a thickness direction underneath the surface layer is still lyophilic. As a result, a contact line may be fixed at the lyophilic-lyophobic interface of bank2 during drying of the printed organic functional ink droplets. This is called pinning effect, which usually leads to significant film climbing at the edge, as shown in FIG. 3. FIG. 3 shows a schematic view of morphology of a film after drying in a pixel unit in the prior art. As shown in FIG. 3, the morphology of the dried film is a special result of the coffee ring effect in a pixel unit. FIG. 4 shows a schematic diagram of a cross-section of a dried film in a pixel unit in the prior art. It can be seen that a thickness of the film at the edge region of the droplet after drying is significantly larger than that at the center region of the droplet. This is a result of interaction of solute migration caused by Marangoni convection inside the droplet during the drying process and the pinning effect at the interface.

Figure 5:
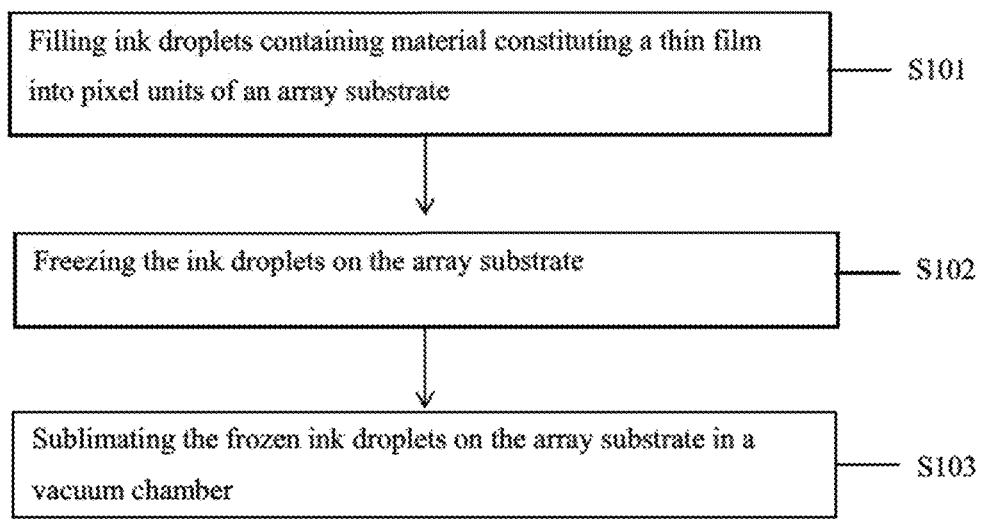
FIG. 5 is a flow chart of a method for fabricating a film according to one embodiment of the present disclosure.

Accordingly, one embodiment of the present disclosure provides a method for fabricating a film which includes the following, as shown in FIG. 5:

At step S101, ink droplets containing material constituting a thin film are filled into pixel units of an array substrate.

The array substrate comprises a plurality of independent pixel units separated by a pixel define layer and arranged in a matrix. In addition, the ink droplets containing the material constituting the thin film can be filled into the pixel units of the array substrate by inkjet printing, ink dropping, or other implementation methods. A specific implementation method can be selected based on actual needs and is not limited here.

At step S102, the ink droplets on the array substrate are frozen.

At step S103, the frozen ink droplets on the array substrate is subjected to vacuum sublimation.

Figure 6A:
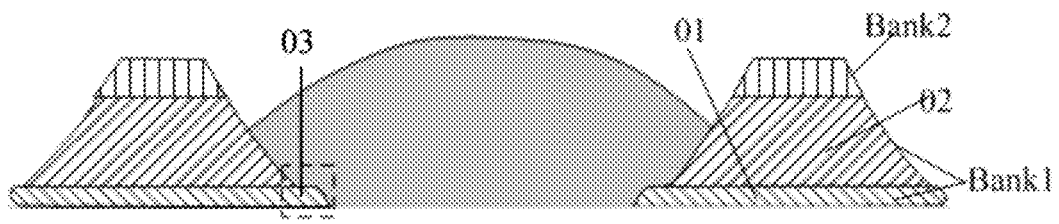
FIGS. 6a-6c are schematic views of a film drying process at different times respectively according to one embodiment of the present disclosure.
Figure 6B:
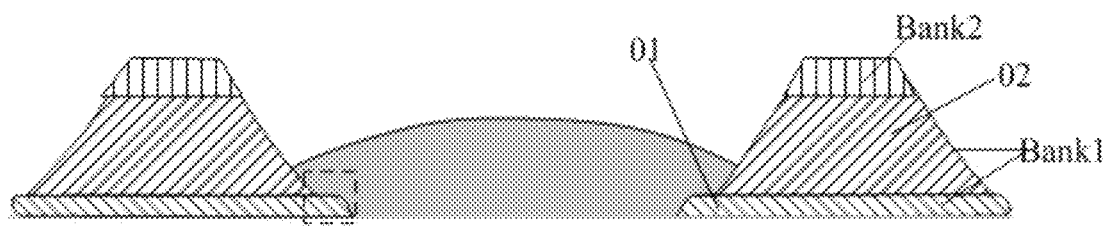
Figure 6C:

In the above-described method according to one embodiment of the present disclosure, after the ink droplets are filled into the pixel units on the array substrate, the array substrate is placed into a freezer. That is, in the process of forming the film, a freeze-drying technique is used. The frozen ink droplets on the array substrate are sublimated in vacuum in a vacuum chamber. As such, the ink droplets in the pixel units are directly sublimated. Vacuum sublimation is a uniform action from a solid surface. This is different from drying of liquid droplets, which usually dry faster at the edge to form a coffee ring phenomenon. As shown in FIGS. 6a-6c, the ink droplets in the pixel unit are freeze-dried and sublimated in vacuum, thereby forming a uniform organic thin film. In addition, because the solvent is directly changed from solid into gas during sublimation, solute concentration of the remaining solution increases after more and more solvent is sublimated. As the solute concentration becomes higher and higher, Marangoni convection becomes weaker and weaker. As a result, the coffee ring phenomenon can be greatly reduced. In this way, the ink droplets are sublimated in vacuum during the film preparation process. This can effectively reduce coffee ring phenomena, which is usually caused due to faster drying at the edge of droplets during the drying process. As such, an organic thin film uniformly distributed in the pixel unit is finally obtained.

In one embodiment, step S102 may specifically include the following: the array substrate is placed in the freezer after the pixel units are filled with ink droplets. The temperature of the freezer is adjusted not to exceed a solidification temperature of the ink droplets. The inkjet droplets on the array substrate are then frozen in the freezer. As shown in FIG. 6a, the ink droplet has a bulging shape in the pixel unit after the array substrate is filled with the ink droplets. At this time, it is preferable to quickly place the array substrate into the freezer, for example, within one minute, and adjust the temperature of the freezer to below or equal to the solidification temperature of the ink droplets. As a result, the ink droplets are in a solidified state in the pixel units.

In one embodiment, step S103 may specifically include the following: the frozen array substrate is placed in a vacuum chamber. A pressure of the vacuum chamber is set not to exceed a triple point pressure of the solvent of the ink droplets. A temperature of the vacuum chamber is set to be greater than a triple point temperature of the solvent of the ink droplets. The ink droplets in the array substrate are sublimed in vacuum. Specifically, in the above-mentioned embodiment of the present disclosure, the frozen array substrate is placed in a vacuum chamber. Then, the pressure and the temperature of the vacuum chamber are adjusted to a condition under which the solvent of the ink droplets sublimates in vacuum. The triple point refers to a temperature and a pressure in thermodynamics at which the three phases including gas, liquid, and solid of a substance coexist. Such triple point pressure and temperature can make the ink droplets in the pixel units to sublimate. Vacuum sublimation is a uniform action from a solid surface. This is different from drying of a liquid droplet, which usually dries faster at the edge and accordingly forms a coffee ring. In one embodiment, the solvent of the ink droplets is water. The triple point temperature and pressure of water solvent is 273.16 K and 610.5 Pa respectively. For other type of solvent of the ink droplets, one of ordinary skill in the art can obtain the triple point temperature and pressure of the solvent by reference to data manuals or even measure them by experiments.

Figure 7:
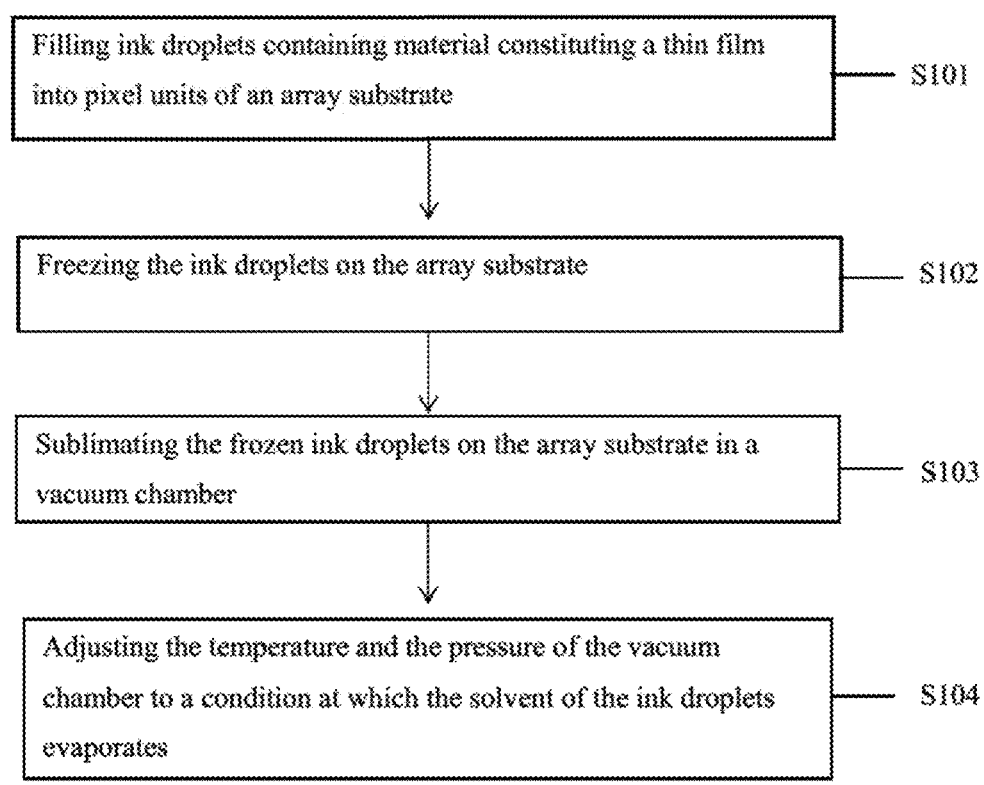
FIG. 7 is a flow chart of a method for fabricating a film according to one embodiment of the present disclosure.

FIG. 7 is a flow chart of a method of fabricating a film according to one embodiment of the present disclosure. As shown in FIG. 7, the method may further include a step S104. In step S104, after a preset time of vacuum sublimation of the ink droplets on the array substrate, the temperature and the pressure of the vacuum chamber are adjusted to a condition at which the solvent of the ink droplets evaporates. The preset time of vacuum sublimation may be within a range between 30 seconds to 30 minutes, preferably between 5 minutes to 25 minutes, and more preferably between 10 minutes to 25 minutes. In one embodiment, after the droplets on the array substrate are sublimated in vacuum for a certain time, because the solvent is changed from solid into gas directly during sublimation, a solute concentration of the remaining solution is increased after more and more solvent is sublimated. After the preset time, the temperature of the vacuum chamber can be adjusted to a temperature at which the solvent of the ink droplets evaporates. As the concentration becomes higher and higher, Marangoni convection becomes weaker and weaker. Thus, the coffee ring phenomenon can be greatly reduced and an organic film uniformly distributed in the pixel is obtained. Furthermore, after sublimation for the preset time, the temperature is adjusted to the evaporating temperature at which the ink droplets return to the liquid state. As the liquid droplets flow, the ink droplets are uniformly distributed within the pixel units, rather than in the bulging shape in the frozen state. As a result, a uniform organic film is obtained in the pixel unit.

According to similar inventive concept, an embodiment of the present disclosure provides a method of fabricating an array substrate. The method of fabricating the array substrate includes the method for fabricating the thin film as described above according to one embodiment of the present disclosure. Since the principle of the method of fabricating the array substrate is similar to that for producing the film, the fabrication method of the array substrate can be carried out with reference to the above-described method of fabricating the thin film, and the repetition is not repeated herein.

In one embodiment, the method of fabricating an array substrate further includes forming a pattern of pixel define layers on a base substrate of the array substrate. Specifically, the process of fabricating the array substrate includes fabricating a plurality of film layers including a gate electrode layer, an active layer, a source-drain electrode layer, a pixel electrode layer and a common electrode layer. It also includes fabrication of a pixel define layer. Pluralities of pixel units are separated by the pixel define layer and arranged in a matrix on the array substrate.

In one embodiment, as shown in FIGS. 6(a)-6(c), the formed pixel define layer includes a lyophilic layer Bank1 and a lyophobic layer Bank2. The lyophobic layer Bank2 is located above the lyophilic layer Bank1. Specifically, the pixel define layer may be a two-layer structure which includes a lower lyophilic layer and an upper lyophobic surface. The lyophilic layer is used to adsorb and fix ink droplets within the pixel unit. The lyophobic layer prevents the droplet from overflowing the pixel unit.

In one embodiment, as in FIGS. 6a-6c, the lyophilic layer Bank1 includes a first sub-film layer 01 and a second sub-film layer 02. The first sub-film layer 01 is below the second sub-film layer 02. A positive projection of the first sub-film layer 01 on the base substrate is larger than that of the second sub-layer 02 on the base substrate. Specifically, as shown in FIGS. 6a-6c, the first sub-film layer has a protruded step section 03 relative to a bottom of the second sub-film layer, as encircled with a dashed box in FIGS. 6a-6c. The protruded step section 03 of the first sub-film layer 01 may block the edge of the droplet contacting the second sub-film layer 02. Furthermore, the protruded step sections have a function of defining the light emitting area. That is, a light transmission area of the pixel unit is realized by a middle part between the protruded step sections of the first sub-film layers. As a result, defects such as a coffee ring formed at the edge of the droplet contacting the second sub-film layer can be prevented from affecting emitting light of the pixel unit.

Another embodiment of the present disclosure provides a display panel. The display panel includes the array substrate fabricated by the method according to one embodiment of the present disclosure. The display panel may be an organic light emitting display (OLED) panel. The light emitting layer, the hole injection layer, and the electron transport layer of the organic light emitting display panel can be produced by the above-described method of fabricating a thin film according to one embodiment of the present disclosure.

Embodiments of the present disclosure provide a method for fabricating a thin film, a method for fabricating an array substrate, and a display panel. In one embodiment, the method for fabricating the film comprises the following: ink droplets containing material constituting a thin film are filled into pixel units of the array substrate. The pixel units are separated by a pixel define layer and independent from each other. The pixel units are arranged in a matrix. The ink droplets on the array substrate are then frozen. The frozen array substrate is then vacuum sublimated. As such, a freeze-drying technique is used in the film production process. The frozen array substrate is placed in a vacuum chamber for sublimation in vacuum so that solvent of the ink droplets is sublimated. Sublimation in vacuum is a uniform action from a solid surface. As a result, coffee ring phenomenon can be effectively reduced. A uniform organic thin film in the pixel unit is eventually obtained.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. It is intended that the present invention encompasses such modifications and variations if they come within the scope of the appended claims or the equivalents thereof. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A method of fabricating a film, comprising:
   filling ink droplets containing a solvent and material constituting the film into pixel units of an array substrate;
   freezing the ink droplets on the array substrate; and sublimating the solvent of the ink droplets on the array substrate, wherein the pixel units of the array substrate are separated by a pixel define layer and arranged in a matrix, and sublimating the solvent of the ink droplets on the array substrate comprises:

placing the array substrate into a vacuum chamber;

adjusting a pressure of the vacuum chamber to a value not exceeding a triple point pressure of the solvent of the ink droplets;

adjusting a temperature of the vacuum chamber to a value greater than a triple point temperature of the solvent of the ink droplets; and sublimating the solvent of the ink droplets on the array substrate in vacuum.

2. The method of according to claim 1, wherein the ink droplets are filled into the pixel units of the array substrate by an inkjet printing method or an ink dropping method.

3. The method according to claim 1, wherein freezing the ink droplets on the array substrate comprises:

placing the array substrate into a freezer after filling the ink droplets;

adjusting a temperature of the freezer to a value not exceeding a solidification temperature of the ink droplets; and freezing the ink droplets on the array substrate.

4. The method according to claim 3, wherein the array substrate is placed into the freezer within 1 minute after filling the ink droplets.

5. The method according to claim 1, wherein sublimating the solvent of the ink droplets on the array substrate in vacuum is performed for a time within a range of 30 seconds to 30 minutes.

6. The method according to claim 1, further comprising:

adjusting the temperature and the pressure of the vacuum chamber to a condition the solvent of the ink droplets evaporates after sublimating the solvent of the ink droplets, and evaporating the solvent of the ink droplets.

7. A method for fabricating an array substrate, comprising the method of producing the film according to claim 1.

8. An array substrate fabricated according to claim 7.

9. The array substrate according to claim 8, wherein the pixel define layer includes a lyophilic layer and a lyophobic layer; and wherein the lyophobic layer is above the lyophilic layer.

10. The array substrate according to claim 9, wherein the lyophilic layer includes a first sub-film layer and a second sub-film layer; and wherein the first sub-film layer is below the second sub-film layer, and a positive projection of the first sub-film layer on the base substrate is larger than a positive projection of the second sub-film layer on the base substrate.

11. A display panel comprising the array substrate according to claim 8.

12. The display panel according to claim 11, wherein the display panel is an organic light emitting display panel.

* * * * *